(12) United States Patent  
Fujimoto

(10) Patent No.: US 8,617,797 B2  
(45) Date of Patent: *Dec. 31, 2013

(54) PATTERN FORMING METHOD, SEMICONDUCTOR DEVICE MANUFACTURING METHOD AND PHASE SHIFT PHOTOMASK HAVING DUMMY GATE PATTERNS

(75) Inventor: Masashi Fujimoto, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/484,966

(22) Filed: May 31, 2012

(65) Prior Publication Data

US 2012/0237879 A1   Sep. 20, 2012

Related U.S. Application Data

(63) Continuation of application No. 12/801,424, filed on Jun. 8, 2010, now Pat. No. 8,192,919, which is a continuation of application No. 11/374,009, filed on Mar. 14, 2006, now Pat. No. 7,776,514.

(30) Foreign Application Priority Data

Mar. 17, 2005 (JP) ................................. 2005-078125

(51) Int. Cl.  
*H01L 21/00* (2006.01)

(52) U.S. Cl.  
USPC ............................ 430/311; 430/312; 430/394

(58) Field of Classification Search  
USPC ........................................ 430/311, 312, 394  
See application file for complete search history.

(56) References Cited

U.S. PATENT DOCUMENTS

| 6,660,462 | B1 | 12/2003 | Fukuda |
| 6,812,155 | B2 | 11/2004 | Fujimoto |
| 7,776,514 | B2 | 8/2010 | Fujimoto |
| 2003/0198878 | A1 | 10/2003 | Minami |
| 2004/0067423 | A1 | 4/2004 | Chen et al. |
| 2005/0164129 | A1 | 7/2005 | Minami |
| 2005/0202321 | A1 | 9/2005 | Gordon et al. |

FOREIGN PATENT DOCUMENTS

| JP | 57-62052 A | 4/1982 |
| JP | 2003-168640 A | 6/2003 |

*Primary Examiner* — Jonathan Jelsma  
(74) *Attorney, Agent, or Firm* — McGinn Intellectual Property Law Group, PLLC

(57) ABSTRACT

A method for manufacturing a semiconductor device that includes a plurality of gate patterns in parallel with each other within one circuit block provided over a semiconductor substrate includes preparing a first photomask, performing a first photolithography process upon a photoresist layer within a circuit block by using the first photomask, preparing a second photomask that includes a trim photomask having at least one trim opening corresponding to a dummy gate pattern to remove a portion of the photoresist layer corresponding to the dummy gate pattern, and performing a second photolithography process upon the photoresist layer by using the second photomask.

6 Claims, 18 Drawing Sheets

Fig. 9
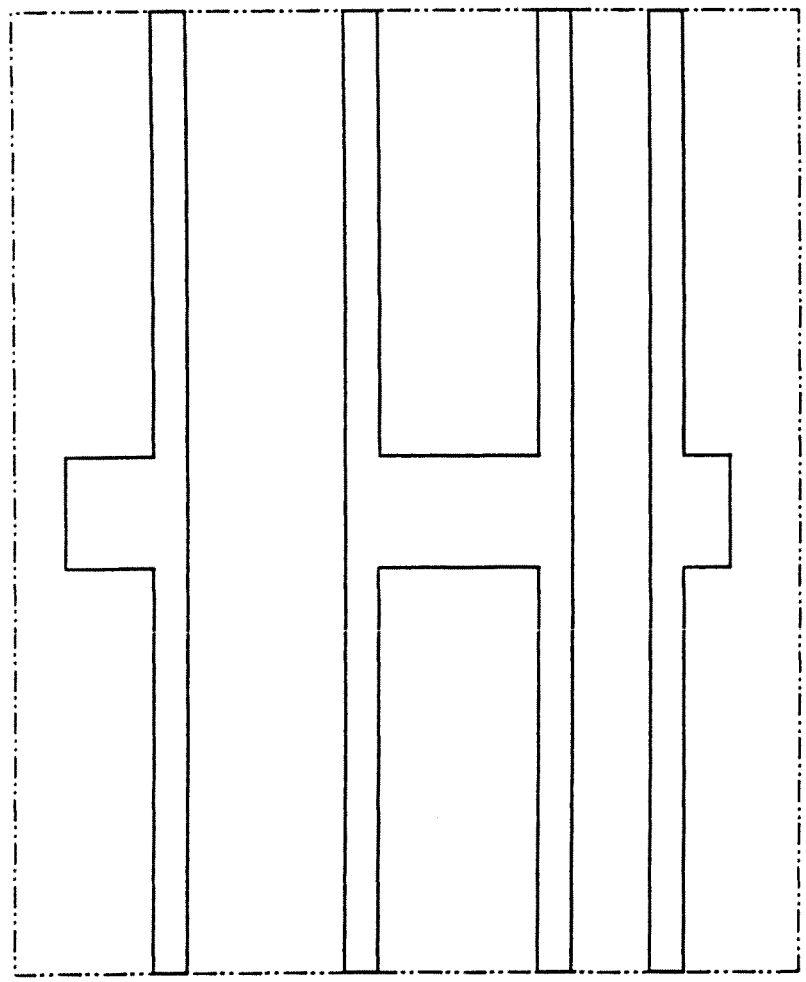
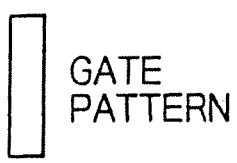 GATE PATTERN

Fig. 10
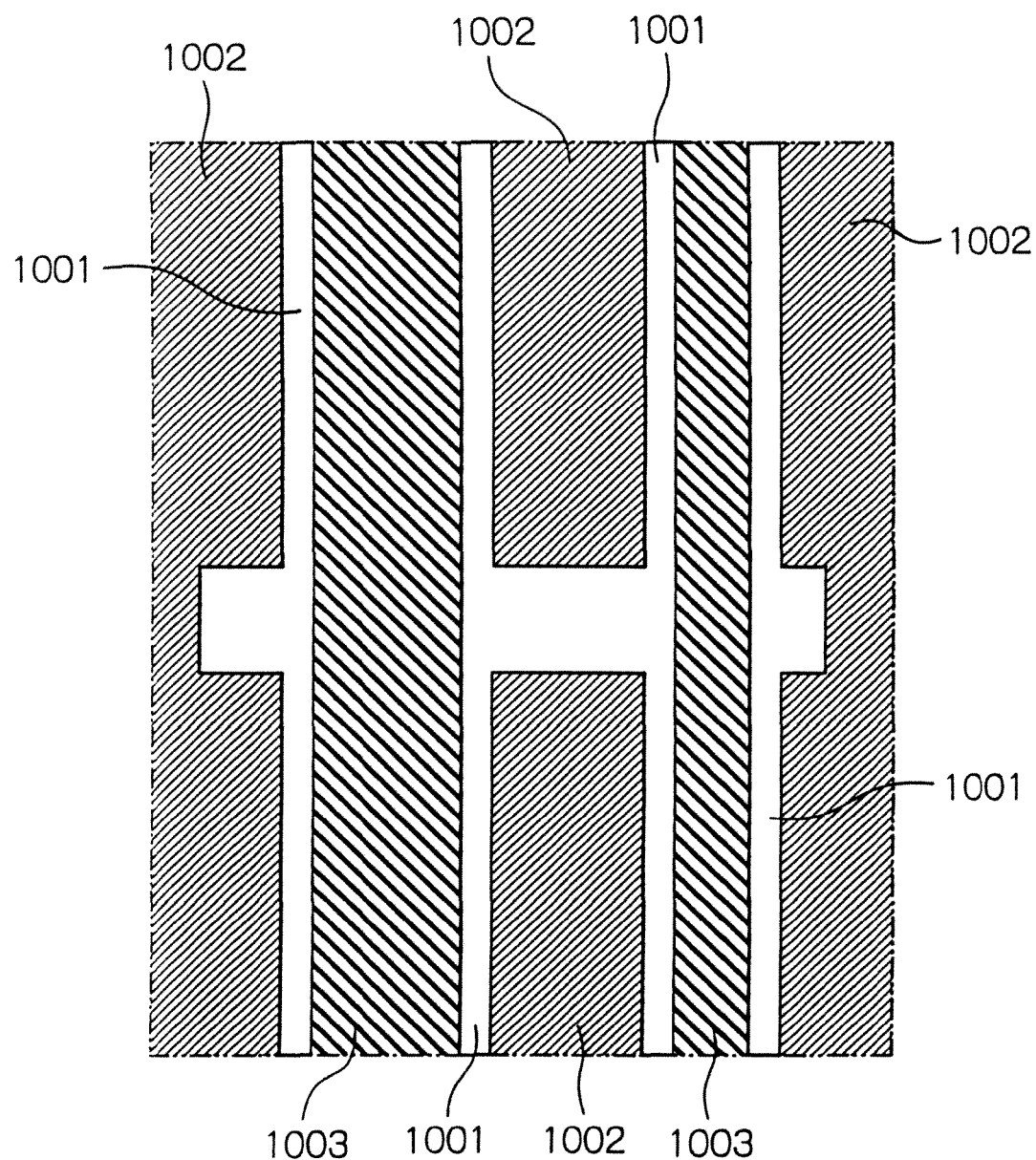
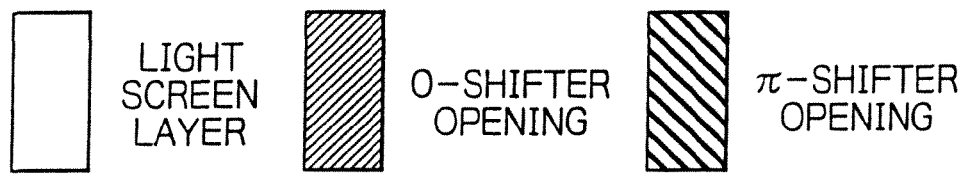

Fig. 16
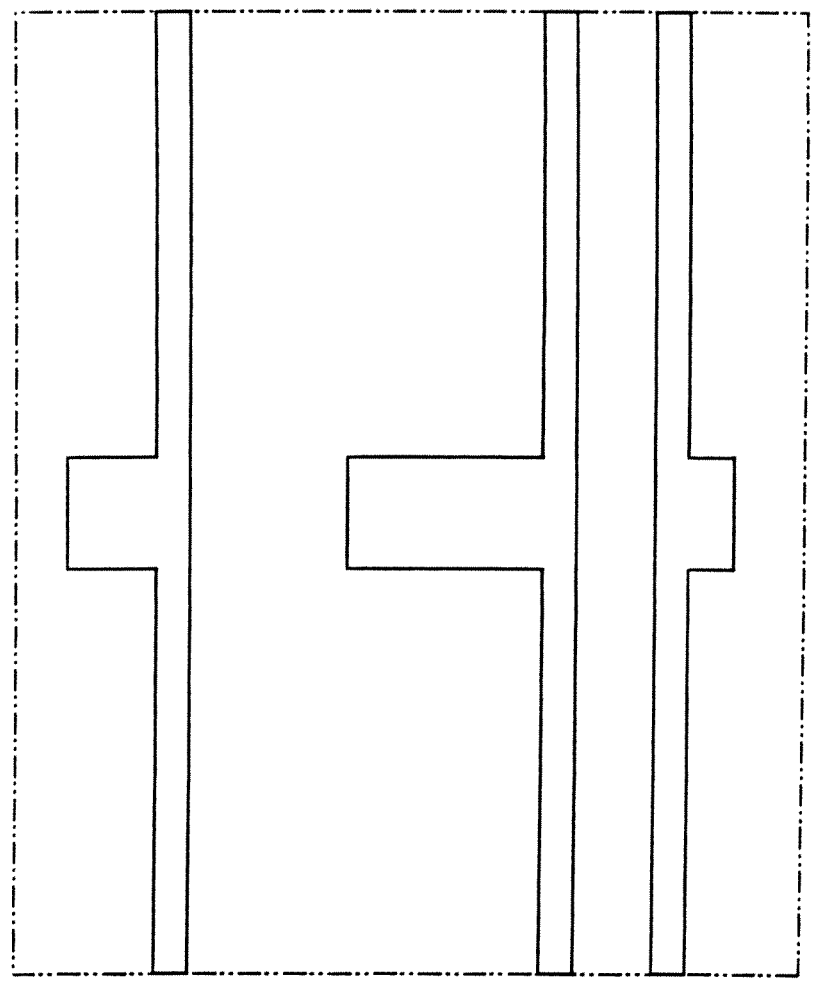
 GATE PATTERN

Fig. 17
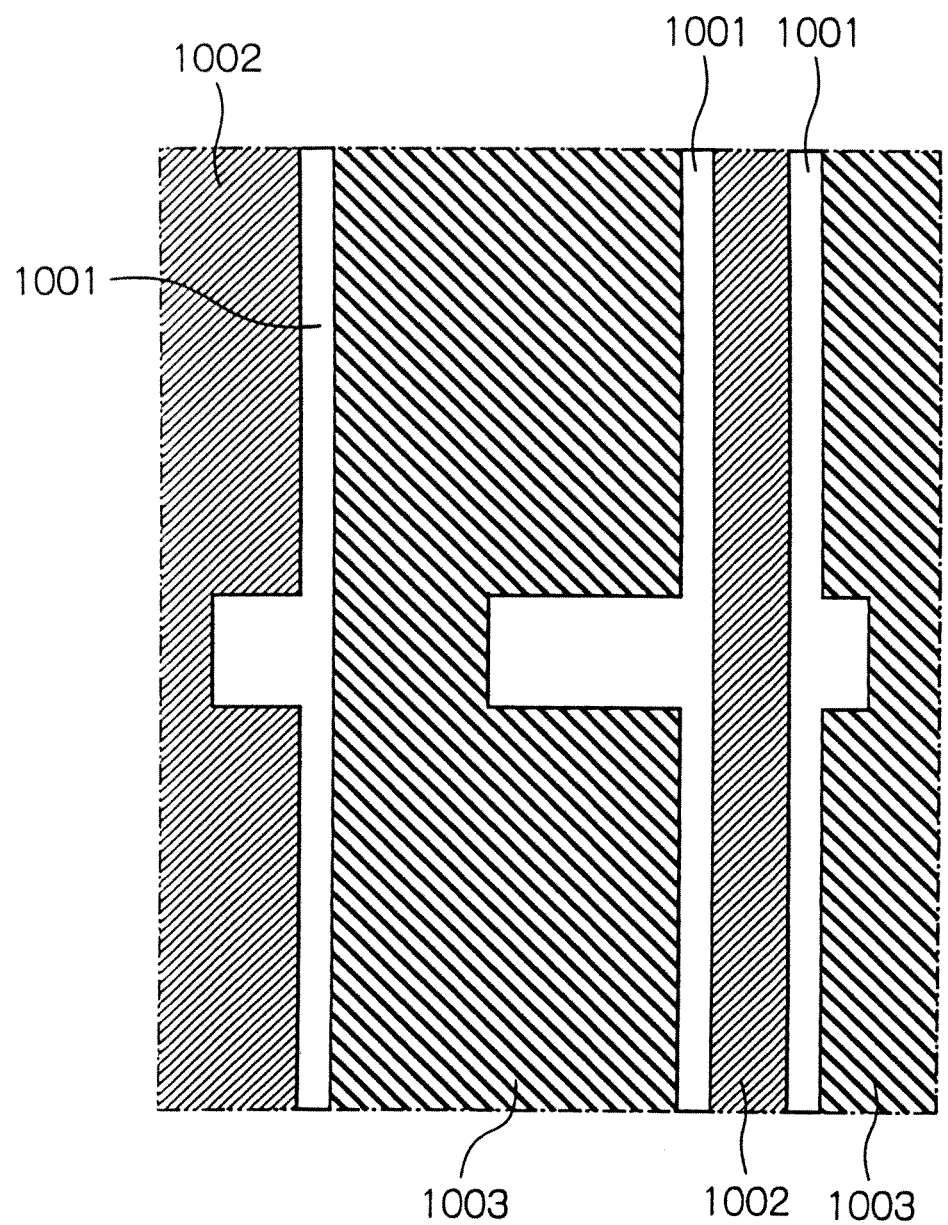

PATTERN FORMING METHOD, SEMICONDUCTOR DEVICE MANUFACTURING METHOD AND PHASE SHIFT PHOTOMASK HAVING DUMMY GATE PATTERNS

The present application is a Continuation Application of U.S. patent application Ser. No. 12/801,424, filed on Jun. 8, 2010, now U.S. Pat. No. 8,192,919 which is a Continuation Application of U.S. patent application Ser. No. 11/374,009, now U.S. Pat. No. 7,776,514, filed on Mar. 14, 2006, which is based on and claims priority from Japanese patent application No. 2005-078125, filed on Mar. 17, 2005, the entire contents of which are incorporated herein by reference.

BACKGROUND OF THE INVENTION

1. Field of the Invention

The present invention relates to a method for forming gate patterns in parallel on a photoresist layer, a method for manufacturing a semiconductor device having gate patterns in parallel, and a phase shift photomask used in such a forming method and such a semiconductor device manufacturing method.

2. Description of the Related Art

Generally, in semiconductor manufacturing processes, photolithography technology by photomasks has been used.

In the photolithography technology, a resolution limit for defining a dimension of a minimum pattern such as a gate pattern depends upon a wavelength of exposure light. Generally, since it is difficult to form gate patterns having a smaller dimension than a half wavelength of the exposure light, various high resolution techniques have been developed. One approach is a phase shift photomask such as a Levenson-type phase shift photomask where two transmitted light components opposite in phase from two openings are compensated for in a so-called phase edge which corresponds to one gate pattern (see: JP-57-62052-A).

In a first prior art method for manufacturing a semiconductor device where first and second groups of gate electrodes are arranged perpendicular to each other, a phase shift photomask and a trim photomask for trimming unnecessary phase edges are used (see: JP-2003-168640-A). This will be explained later in detail.

In the above-described first prior art manufacturing method, however, since the first group of gate electrodes are perpendicular to the second group of gate electrodes, if the integration is enhanced, the same phase light components may become closer to each other below gate patterns, which would reduce the resolution limit of the gate electrodes.

In a second prior art method for manufacturing a semiconductor device where all gate electrodes are arranged along one direction, a phase shift photomask and a trim photomask for the trimming unnecessary phase edges are also used (see: 2003-168640-A). This also will be explained later in detail.

In the above-described second prior art manufacturing method, since all the gate electrodes are arranged in parallel to each other, if the integration is further enhanced, the same phase light components hardly become closer to each other below gate patterns, which would not reduce the resolution limit of the gate electrodes.

SUMMARY OF THE INVENTION

In the above-described second prior art manufacturing method, however, since positive use is made of the optical interference, the gate patterns are affected by the distortion of light, i.e., the aberration of a projection lens. Particularly, in the coma aberration, the asymmetrical amount of gate patterns (images) depends upon the distance between the gate patterns. That is, the larger the distance between two adjacent ones of the gate patterns, the larger the deviation of the width thereof.

Also, according to the optical proximity effect caused by the light interference, since the gate patterns are arranged in parallel with each other, the longitudinal length of each of the gate patterns is remarkably decreased and the corners of the gate patterns are remarkably rounded.

According to the present invention, in a method for forming a plurality of gate patterns in parallel with each other on a photoresist layer within one circuit block, at least one dummy gate pattern is formed in parallel with the gate patterns when a pitch between the gate patterns is larger than a predetermined maximum pitch, so that pitches between the gate patterns including the dummy gate pattern are smaller than the predetermined maximum pitch. Then, a photolithography process is performed upon the photoresist layer by using a phase shift photomask having first and second openings whose difference in phase is $\pi$. The first and second openings alternate between the gate patterns including the dummy gate pattern to form phase edges therein.

Also, in a method for manufacturing a semiconductor device having a plurality of gate patterns in parallel with each other within one circuit block, at least one dummy gate pattern is formed in parallel with the gate patterns when a pitch between the gate patterns is larger than a predetermined maximum pitch, so that pitches between the gate patterns including the dummy gate pattern are smaller than the predetermined maximum pitch. Then, a first photolithography process is performed upon a photoresist layer within the circuit block by using a phase shift photomask having first and second openings whose difference in phase is $\pi$. The first and second openings alternate between the gate patterns including the dummy gate pattern to form phase edges therein. Then, a second photolithography process is performed upon the photoresist layer by using a trim photomask having at least one trim opening corresponding to the dummy gate pattern to remove a portion of the photoresist layer corresponding to the dummy gate pattern, after the first photolithography process is performed. Then, an etching process is performed upon a conductive layer by using the photoresist layer subjected to the first and second photolithography processes as a mask.

Further, in a method for manufacturing a semiconductor device having a plurality of gate patterns in parallel with each other within one circuit block, at least one dummy gate pattern is formed in parallel with the gate patterns when a pitch between the gate patterns is larger than a predetermined maximum pitch, so that pitches between the gate patterns including the dummy gate pattern are smaller than the predetermined maximum pitch. Then, a first photolithography process is performed upon a first photoresist layer within the circuit block by using a phase shift photomask having first and second openings whose difference in phase is $\pi$. The first and second openings alternate between the gate patterns including the dummy gate pattern to form phase edges therein. Then, a first etching process is performed upon a conductive layer by using the first photoresist layer subjected to the first photolithography process as a mask. Then, the first photoresist layer is removed and a second photoresist layer is coated on the conductive layer, after the first etching process is performed. Then, a second photolithography process is performed upon the second photoresist layer by using a trim photomask having at least one trim opening corresponding to the dummy gate pattern to remove a portion of the photoresist layer corresponding to the dummy gate pattern. Then, a second etching process is performed upon the conductive layer by using the second photoresist layer subjected to the second photolithography process as a mask.

Additionally, in a phase shift photomask for a plurality of gate patterns in parallel with each other within one circuit block, a light screen section is provided to correspond to the gate patterns and at least one dummy gate pattern in parallel with the gate patterns, when a pitch between the gate patterns is larger than a predetermined maximum pitch, so that pitches between the patterns including the dummy gate pattern are smaller than the predetermined maximum pitch. First and second opening sections whose difference in phase is $\pi$ are provided. The first and second opening sections alternate between the gate patterns including dummy pattern to form phase edges therein.

The following claims A, B, C, D, E and F are preserved:
- A. A method for forming a plurality of gate patterns in parallel with each other on a photoresist layer within one circuit block, comprising:
  - forming extension gate patterns on both ends of said gate patterns and said dummy gate pattern reaching an edge of said circuit block; and
  - performing a first photolithography process upon said photoresist layer by using a phase shift photomask having first and second openings whose difference in phase is $\pi$, said first and second openings alternating between said gate patterns including said extension gate patterns to form phase edges therein.
- B. The method as set forth in claim A, further comprising performing a second photolithography process upon said photoresist layer by using a trim photomask having trim openings corresponding to said extension gate patterns to remove a portion of said photoresist layer corresponding to said extension gate patterns, after said first photolithography process is performed.
- C. A method for manufacturing a semiconductor device having a plurality of gate patterns in parallel with each other within one circuit block, comprising:
  - forming extension gate patterns on both ends of said gate patterns and said dummy gate pattern reaching an edge of said circuit block;
  - performing a first photolithography process upon a photoresist layer within said circuit block by using a phase shift photomask having first and second openings whose difference in phase is $\pi$, said first and second openings alternating between said gate patterns including said extension gate patterns to form phase edges therein;
  - performing a second photolithography process upon said photoresist layer by using a trim photomask having at least one trim opening corresponding to said extension gate patterns to remove a portion of said photoresist layer corresponding to said extension gate patterns, after said first photolithography process is performed; and
  - performing an etching process upon a conductive layer by using said photoresist layer subjected to said first and second photolithography processes as a mask.
- D. A method for manufacturing a semiconductor device having a plurality of gate patterns in parallel with each other within one circuit block, comprising:
  - forming extension gate patterns on both ends of said gate patterns and said dummy gate pattern reaching an edge of said circuit block,
  - performing a first photolithography process upon a first photoresist layer within said circuit block by using a phase shift photomask having first and second openings whose difference in phase is $\pi$, said first and second openings alternating between said gate patterns including said extension gate patterns to form phase edges therein;
  - performing a first etching process upon a conductive layer by using said first photoresist layer subjected to said first photolithography process as a mask;
  - removing said first photoresist layer and coating a second photoresist layer on said conductive layer after said first etching process is performed;
  - performing a second photolithography process upon said second photoresist layer by using a trim photomask having at least one trim opening corresponding to said extension gate patterns to remove a portion of said photoresist layer corresponding to said extension gate patterns; and
  - performing a second etching process upon said conductive layer by using said second photoresist layer subjected to said second photolithography process as a mask.
- E. A phase shift photomask for a plurality of gate patterns in parallel with each other within one circuit block, comprising:
  - a light screen section corresponding to said gate patterns and extension gate patterns on both ends of said gate patterns reaching an edge of said circuit block; and
  - first and second opening sections whose difference in phase is $\pi$, said first and second opening sections alternating between said gate patterns including extension gate patterns to form phase edges therein.

BRIEF DESCRIPTION OF THE DRAWINGS

The present invention will be more clearly understood from the description set forth below, as compared with the prior art, with reference to the accompanying drawings, wherein:

FIGS. 7, 8 and 9 are plan views for explaining an embodiment of the method for forming gate patterns according to the present invention;

FIG. 10 is a plan view of the phase shift photomask for the gate patterns of FIG. 9;

FIGS. 15, 16, 17 and 18 are plan views illustrating modifications of FIGS. 8, 9, 10 and 11, respectively.

DESCRIPTION OF THE PREFERRED EMBODIMENT

Before the description of the preferred embodiment, prior art semiconductor device manufacturing methods will be explained with reference to FIGS. 1, 2, 3, 4, 5 and 6.

Figure 1:
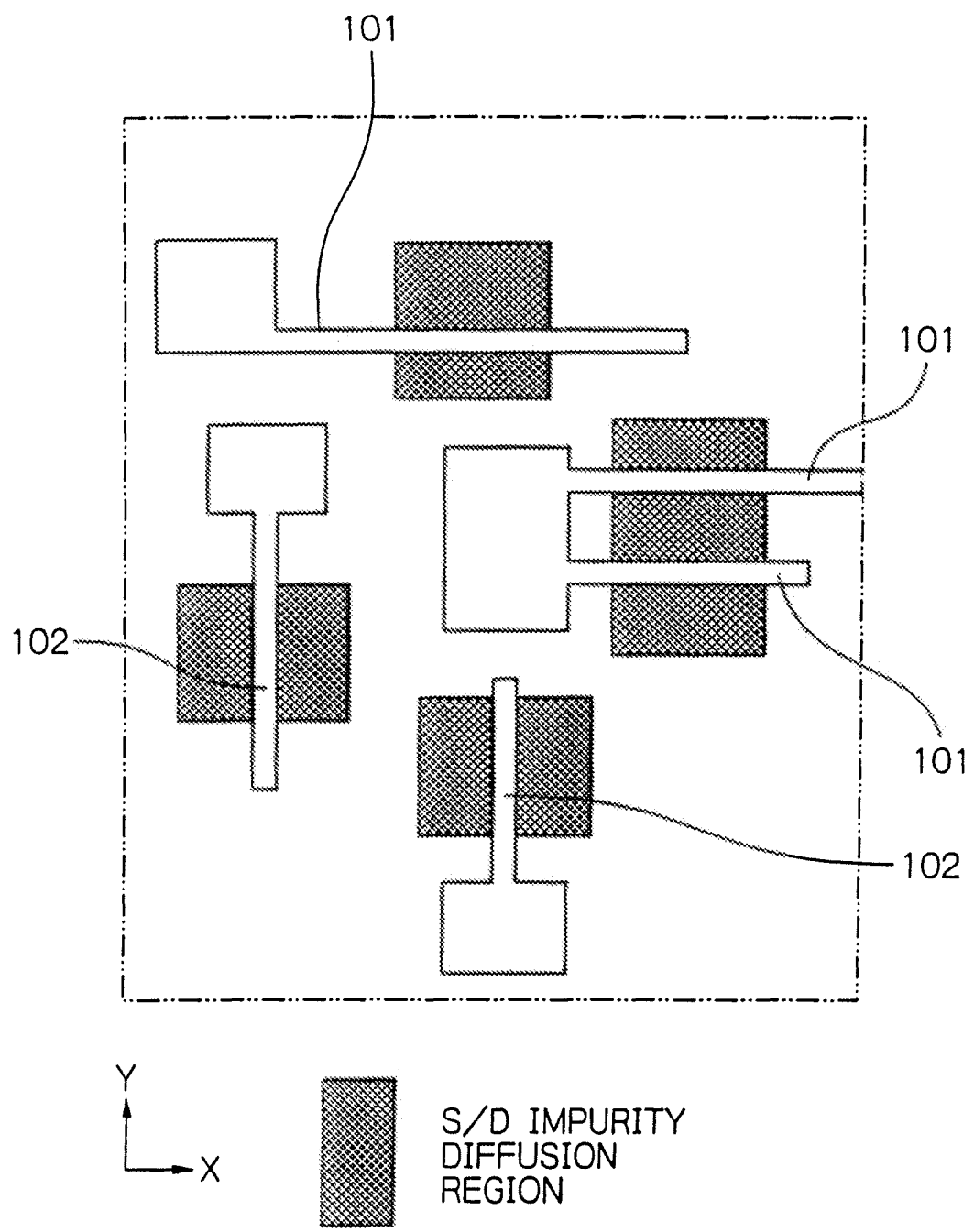
FIG. 1 is a layout diagram illustrating a semiconductor device.

In FIG. 1, which is a layout diagram illustrating a semiconductor device, one circuit block (cell) is illustrated. In FIG. 1, gate electrodes 101 are arranged along an X-direction, while gate electrodes 102 are arranged along a Y-direction. Also, in FIG. 1, shaded portions indicate source/drain impurity diffusion regions.

Figure 2:
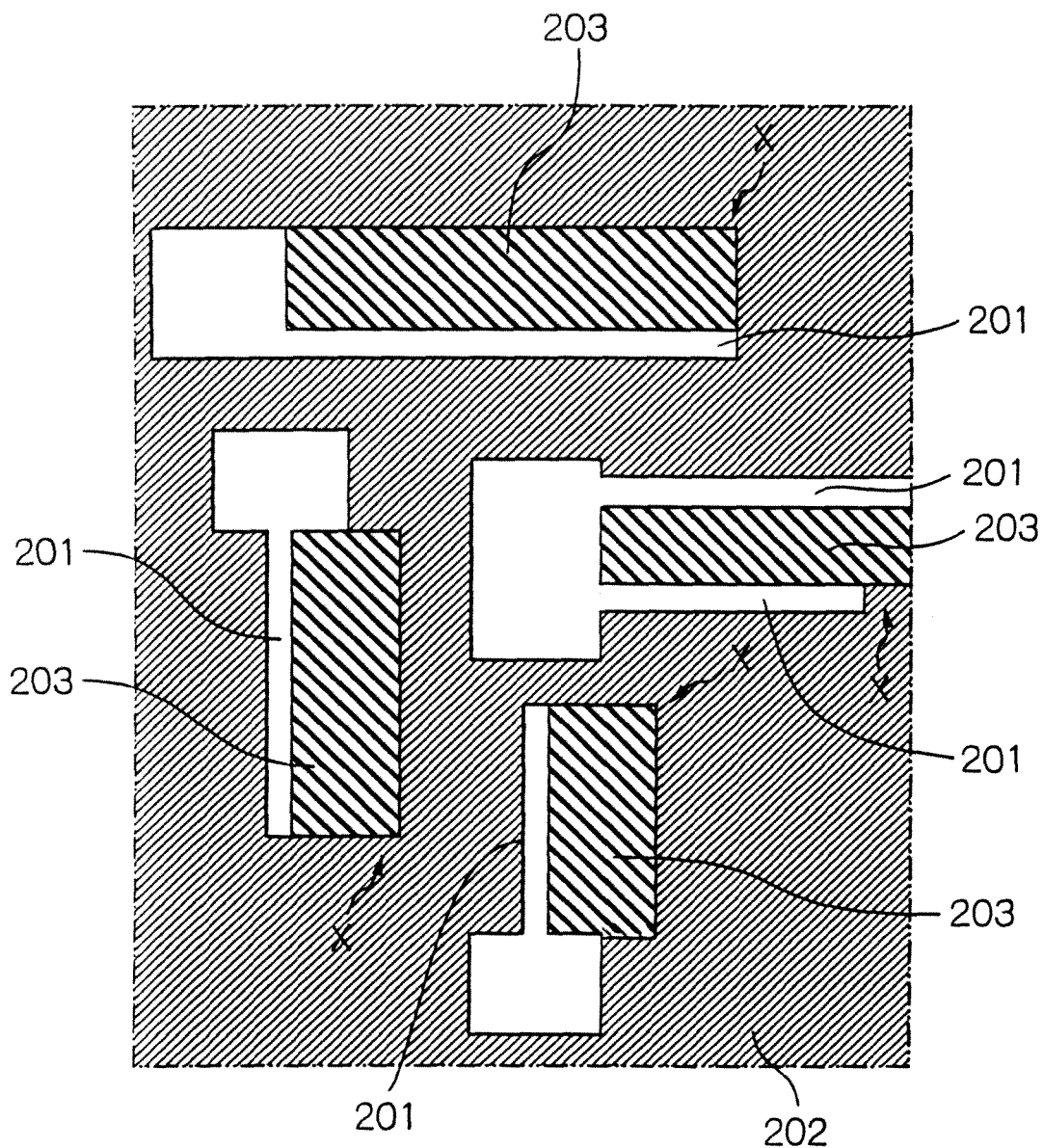
FIG. 2 is a plan view illustrating a first prior art phase shift photomask for manufacturing the gate electrodes of FIG. 1.
Figure 3:
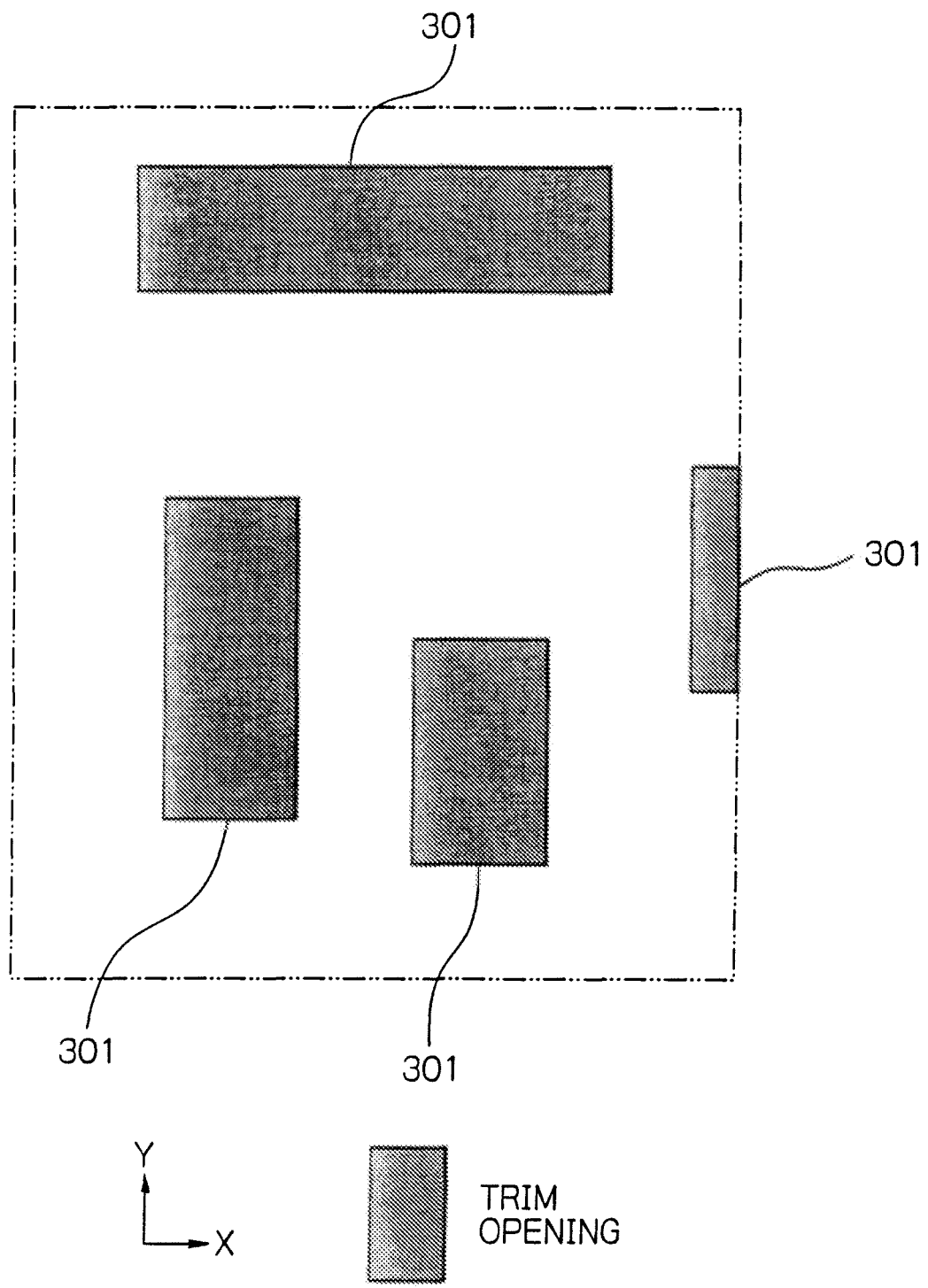
FIG. 3 is a plan view illustrating a first prior art trim photomask for manufacturing the gate electrodes of FIG. 1.

A phase shift photomask as illustrated in FIG. 2 and a trim photomask as illustrated in FIG. 3 are used to manufacture the gate electrodes 101 and 102 of the semiconductor device of FIG. 1 (see: JP-2003-168640-A).

In FIG. 2, light screen layers 201 made of Cr or CrO are provided for the gate electrodes 101 and 102 of FIG. 1. Also, 0-shifter openings 202 and π-shifter openings 203 surround the light screen layers 201 to generate necessary phase edges below the light screen layers 201 whose difference in phase between the 0-shifter openings 202 and the π-shifter openings 203 is zero. As a result, the resolution limit of the gate electrodes 101 and 102 of FIG. 1 can be enhanced.

In FIG. 2, however, unnecessary phase edges indicated as X are generated between the 0-shifter openings 202 and the π-shifter openings 203 other than below the light screen layers 201.

In order to remove the above-mentioned unnecessary phase edges X of FIG. 2, the trim photomask of FIG. 3 is provided to have trim openings 301 corresponding thereto.

The gate electrodes 101 and 102 of FIG. 1 are formed by a multiple photolithography process using the phase shift photomask of FIG. 2 and the trim photomask of FIG. 3 and one etching process, or by a first photolithography and etching process using the phase shift photomask of FIG. 2 and a second photolithography and etching process using the trim photomask of FIG. 3.

In the method for manufacturing the gate electrodes 101 and 102 of FIG. 1 using the phase shift photomask of FIG. 2 and the trim photomask of FIG. 3, however, since the gate electrodes 101 are arranged perpendicular to the gate electrodes 102, if the integration is further enhanced, the same type shift openings 202 (or 203) may become closer to each other below the light screen layers 201, which would reduce the resolution limit of the gate electrodes 101.

Figure 4:
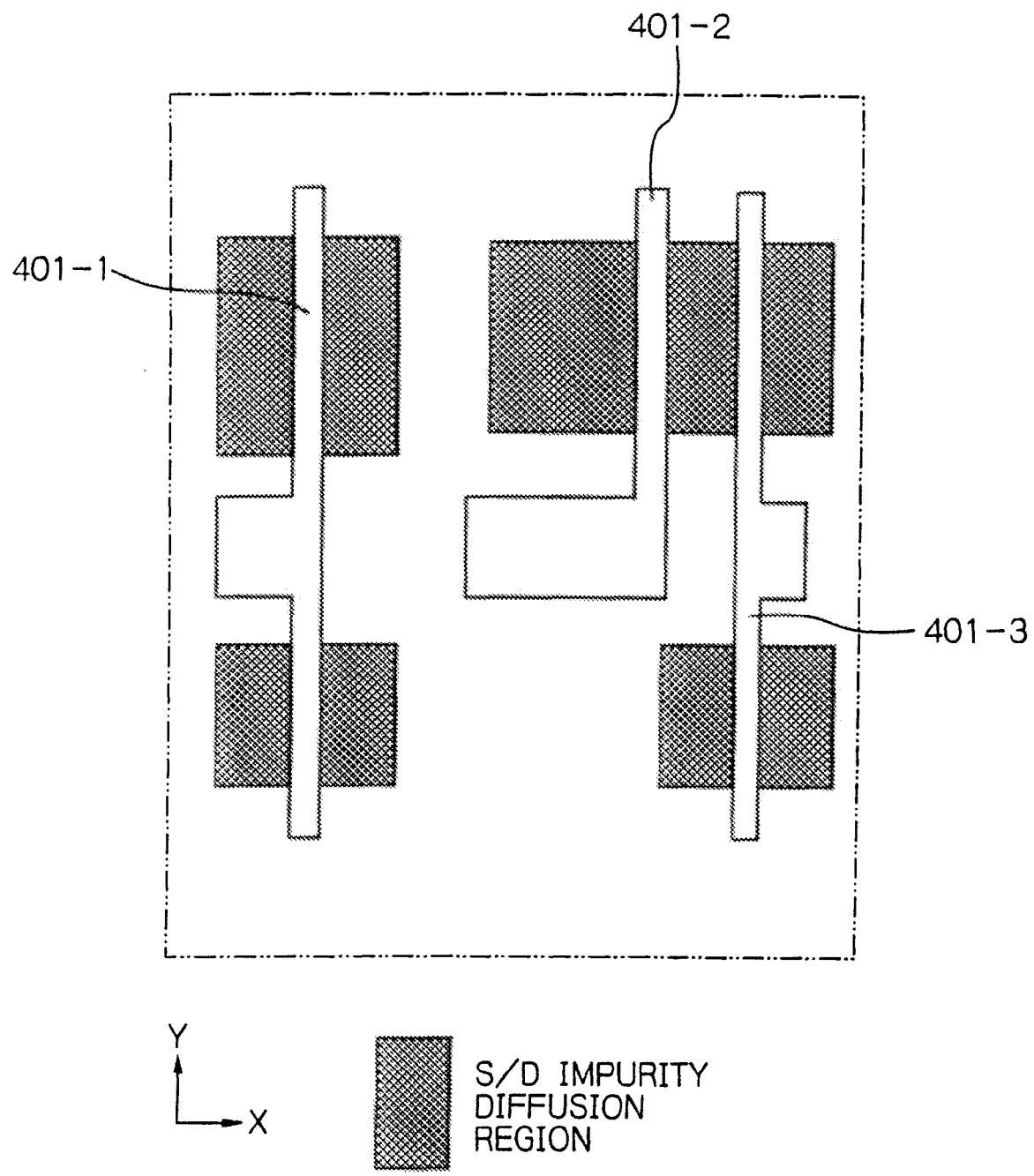
FIG. 4 is a layout diagram illustrating another semiconductor device.

In FIG. 4, which is a layout diagram illustrating another semiconductor device, one circuit block (cell) is illustrated. Also in FIG. 4, all gate electrodes 401-1, 401-2 and 401-3 are arranged along a Y-direction, and shaded portions indicate source/drain impurity diffusion regions.

Figure 5:
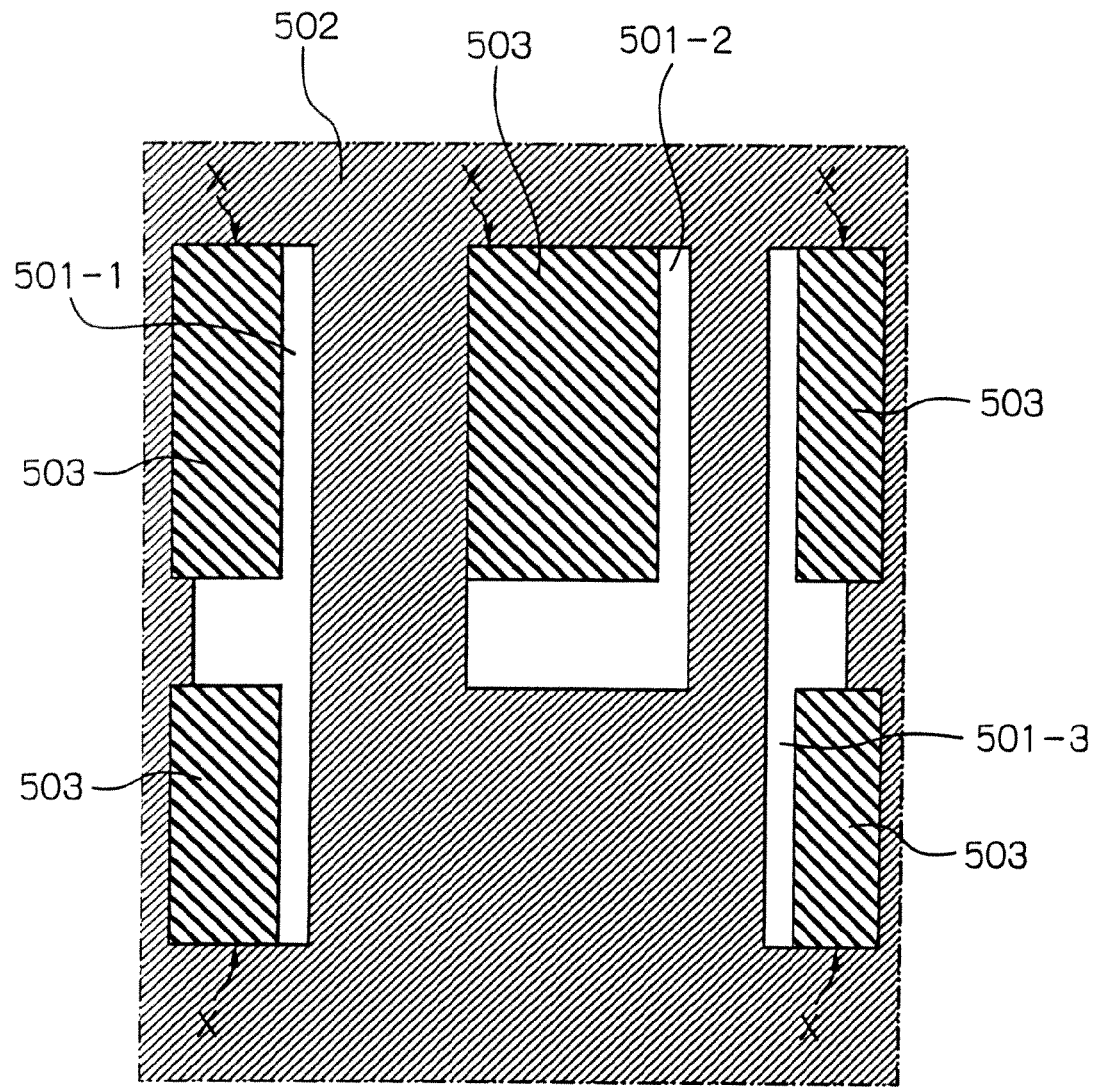
FIG. 5 is a plan view illustrating a second prior art phase shift photomask for manufacturing the gate electrodes of FIG. 4.
Figure 6:
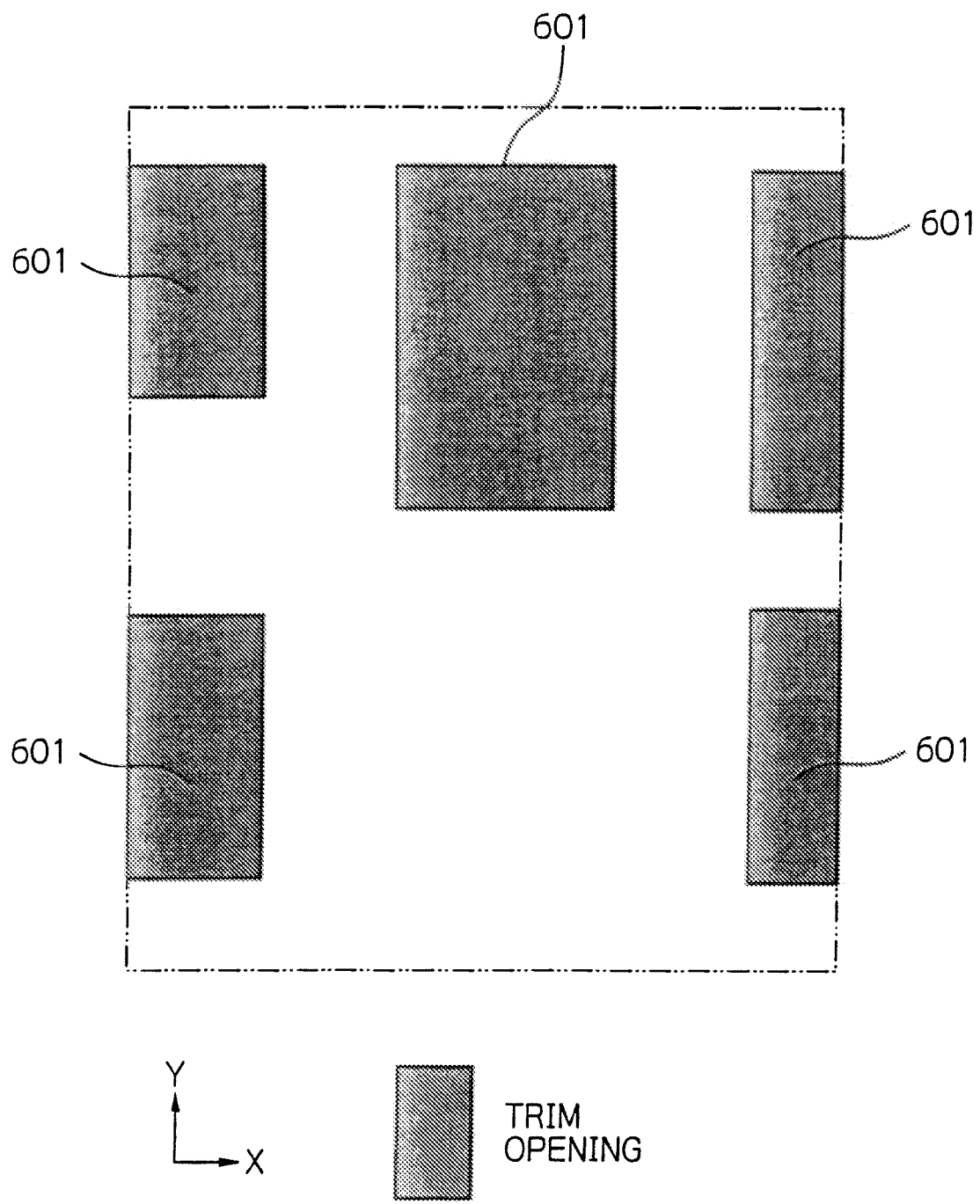
FIG. 6 is a plan view illustrating a second prior art trim photomask for manufacturing the gate electrodes of FIG. 4.

A phase shift photomask as illustrated in FIG. 5 and a trim photomask as illustrated in FIG. 6 are used to manufacture the gate electrodes 401-1, 401-2 and 401-3 of the semiconductor device of FIG. 4 (see: JP-2003-168640-A).

In FIG. 5, light screen layers 501-1, 501-2 and 501-3 made of Cr or CrO are provided for the gate electrodes 401-1, 401-2 and 401-3, respectively, of FIG. 4. Also, 0-shifter openings 502 and π-shifter openings 503 surround the light screen layers 501-1, 501-2 and 501-3 to generate necessary phase edges below the light screen layers 501-1, 501-2 and 501-3 whose difference in phase between the 0-shifter openings 502 and the π-shifter openings 503 is zero. As a result, the resolution limit of the gate electrodes 401-1, 401-2 and 401-3 of FIG. 4 can be enhanced.

In FIG. 5, unnecessary phase edges indicated as X are generated between the 0-shifter openings 502 and the π-shifter openings 503 other than below the light screen layers 501-1, 501-2 and 501-3.

In order to remove the above-mentioned unnecessary phase edges X of FIG. 5, the trim photomask of FIG. 6 is provided to have trim openings 601 corresponding thereto.

The gate electrodes 401-1, 401-2 and 401-3 of FIG. 4 are formed by a multiple photolithography process using the phase shift photomask of FIG. 5 and the trim photomask of FIG. 6 and one etching process, or by a first photolithography and etching process using the phase shift photomask of FIG. 5 and a second photolithography and etching process using the trim photomask of FIG. 6.

In the method for manufacturing the gate electrodes 401-1, 401-2 and 401-3 of FIG. 4 using the phase shift photomask of FIG. 5 and the trim photomask of FIG. 6, since the gate electrodes 401-1, 401-2 and 401-3 are arranged in parallel with each other, if the integration is further enhanced, the same type shift openings 502 (or 503) hardly become closer to each other below the light screen layers 501-1, 501-2 and 501-3, which would not reduce the resolution limit of the gate electrodes 401-1, 401-2 and 401-3.

In the method for manufacturing the gate electrodes 401-1, 401-2 and 401-3 of FIG. 4 using the phase shift photomask of FIG. 5 and the trim photomask of FIG. 6, however, since positive use is made of the optical interference by high coherent light, the gate electrodes 401-1, 401-2 and 401-3 are affected strongly by the distortion of light, i.e., the aberration of a projection lens. Particularly, in the coma aberration for generating an asymmetrical image for a symmetrical image within a face perpendicular to an optical axis, the asymmetrical amount of gate patterns (images) depends upon the distance between the gate electrodes 401-1, 401-2 and 401-3. That is, the larger the distance between two adjacent ones of the gate electrodes 401-1, 401-2 and 401-3, the larger the deviation of the width thereof. Also, according to the optical proximity effect caused by the light interference, the longitudinal length of each of the gate electrodes 401-1, 401-2 and 401-3 is decreased and the corners of the gate electrodes 401-1, 401-2 and 401-3 are rounded. That is, even if the gate electrodes 401-1, 401-2 and 401-3 are arranged in parallel with each other, the patterns of the gate electrodes 401-1, 401-2 and 401-3 depend upon the distance thereof. Although this optical proximity effect can be compensated for by optical proximity correction (OPC) photomasks, there is a limit.

Figure 7:
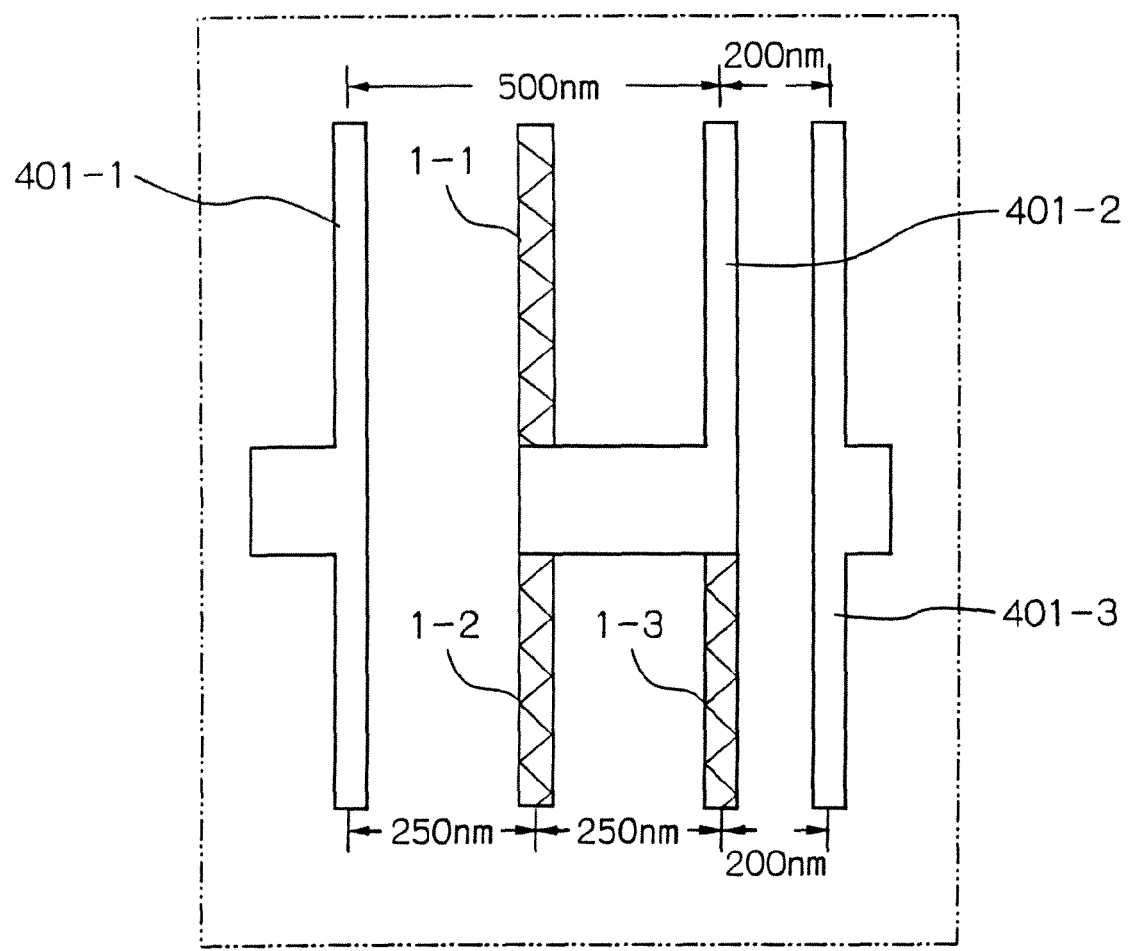
Figure 8:
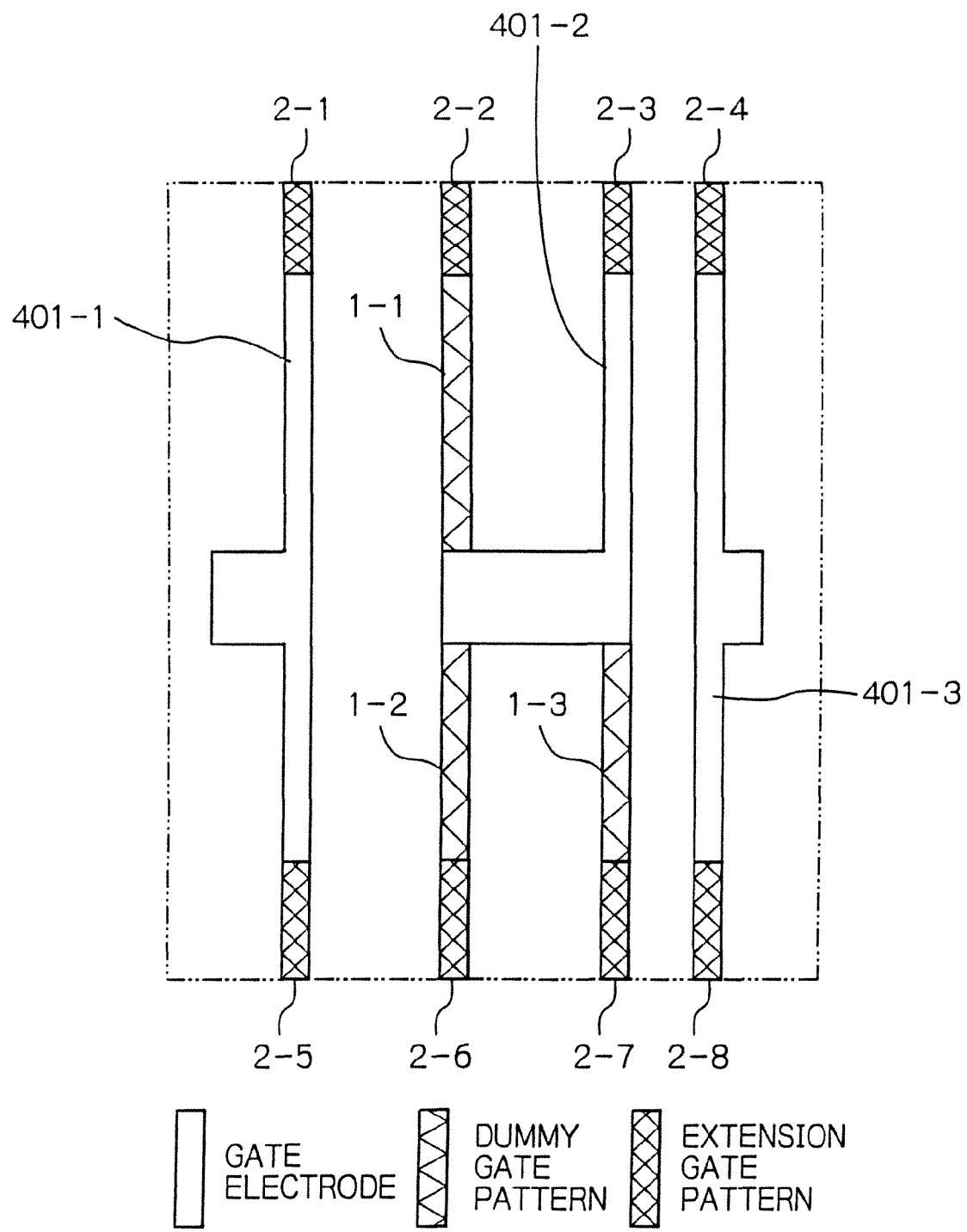

FIGS. 7, 8 and 9 are plan views for explaining an embodiment of the method for forming gate patterns for the gate electrodes 401-1, 401-2 and 401-3 of FIG. 4. In FIGS. 7, 8 and 9, assume that the minimum pitch MIN of gate patterns is 200 nm, and the maximum pitch MAX of the gate patterns is 300 nm, in order to compensate for the coma aberration. The minimum pitch MIN and the maximum pitch MAX will be explained later in detail.

In FIG. 7, if the distance between the gate electrodes 401-1 and 401-2 is 500 nm and the distance between the gate electrodes 401-2 and 401-3 is 200 nm under the condition that the width of each of the gate electrodes 401-1, 401-2 and 401-3 is 70 nm, dummy gate patterns 1-1, 1-2 and 1-3 are provided in parallel with the gate electrodes 401-1, 401-2 and 401-3, so that the distance between the gate electrode 401-1 and the dummy gate pattern 1-1 (1-2) is 250 nm, the distance between the dummy gate patterns 1-2 and 1-3 is 250 nm, and the distance between the dummy gate pattern 1-3 and the gate electrode 401-3 is 200 nm. Thus, the pitch between the gate electrodes 401-1, 401-2 and 401-3 and the dummy gate patterns 1-1, 1-2 and 1-3 is between the minimum pitch MIN and the maximum pitch MAX.

In FIG. 8, extension gate patterns 2-1, 2-2, . . . , 2-8 are added to the ends of the gate electrodes 401-1, 401-2 and 401-3 and the dummy gate patterns 1-1, 1-2 and 1-3, in order to compensate for the optical proximity effect.

Thus, gate patterns as illustrated in FIG. 9 are obtained by combining the dummy gate patterns 1-1, 1-2 and 1-3 and the extension gate patterns 2-1, 2-2, . . . , 2-8 with the gate electrodes 401-1, 401-2 and 401-3.

FIG. 10 is a layout diagram illustrating a phase shift photomask according to the present invention formed for the gate patterns of FIG. 9. In FIG. 10, light screen layers 1001 made of Cr or CrO are provided for the gate patterns of FIG. 9. Also, 0-shifter openings 1002 and π-shifter openings 1003 surround the light screen layers 1001 to generate necessary phase edges below the light screen layers 1001 whose difference in phase between the 0-shifter openings 1002 and the π-shifter openings 1003 is zero. As a result, the resolution limit of the gate patterns of FIG. 9 can be enhanced.

In FIG. 10, the 0-shifter openings 1002 completely alternate with the π-shifter openings 1003 to ease the design thereof. Therefore, even if the integration is further enhanced, the same type openings 1002 (or 1003) never become closer to each other, which would not reduce the resolution limit of the gate patterns.

In FIG. 10, since the 0-shifter openings 1002 and the π-shifter openings 1003 completely alternate with each other, unnecessary phase edges are not generated between the 0-shifter openings 1002 and the π-shifter openings 1003.

Figure 11:
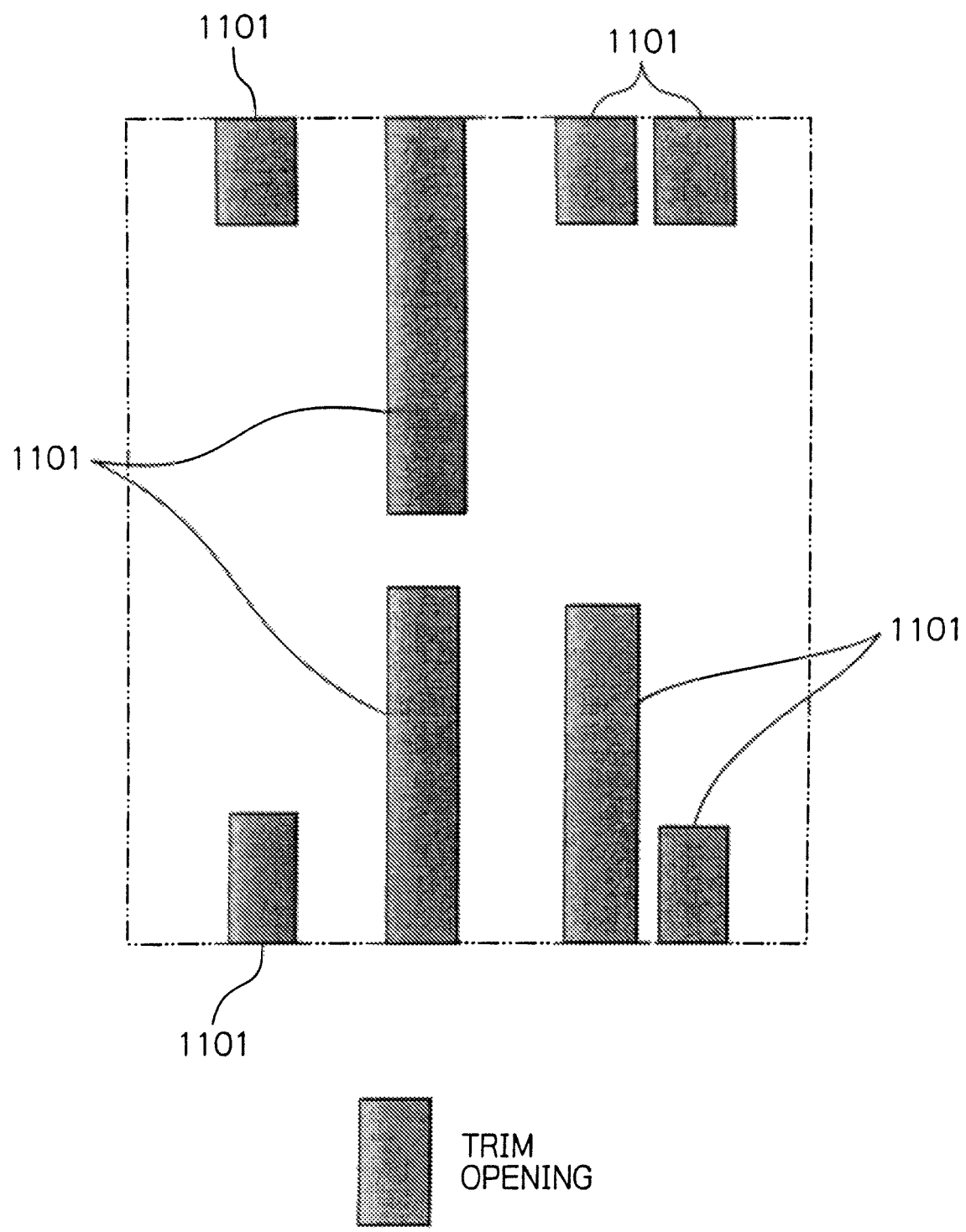
FIG. 11 is a plan view of the trim photomask for the gate patterns of FIG. 9.

After a photolithography process is carried out by using the phase shift photomask of FIG. 10, in order to remove the dummy gate patterns 1-1, 1-2 and 1-3 and the extension gate patterns 2-1, 2-2, . . . , 2-8, a trim photomask as illustrated in FIG. 11 is provided to have trim openings 1101 corresponding thereto. In this case, the data of the trim openings 1101 are derived from the data of the dummy gate patterns 1-1, 1-2 and 1-3 and the extension gate patterns 2-1, 2-2, . . . , 2-8.

Thus, after a photolithography process by using the phase shift photomask of FIG. 10 is performed upon a photoresist layer formed on a semiconductor substrate, a photolithography process by using the trim photomask of FIG. 11 is performed upon the photoresist layer, to remove the dummy gate patterns 1-1, 1-2 and 1-3 and the extension gate patterns 2-1, 2-2, . . . , 2-8.

Note that, after a photolithography and etching process is carried out by using the phase shift photomask of FIG. 10, in order to remove the dummy gate patterns 1-1, 1-2 and 1-3 and the extension gate patterns 2-1, 2-2, . . . , 2-8, the trim photomask as illustrated in FIG. 11 is also provided to have trim openings 1101 corresponding thereto.

Thus, after a photolithography and etching process by using the phase shift photomask of FIG. 10 is performed upon a conductive layer formed on a semiconductor substrate, a photolithography and etching process by using the trim photomask of FIG. 11 is performed upon the conductive layer, to remove the dummy gate patterns 1-1, 1-2 and 1-3 and the extension gate patterns 2-1, 2-2, . . . , 2-8.

Note that the trim photomask of FIG. 11 has a plurality of circuit blocks (cells) spaced by 0.5 μm or more from each other to avoid the optical proximity effect. Also, this trim photomask may have light screen layers and openings for connections between the circuit blocks (cells).

Figure 12:
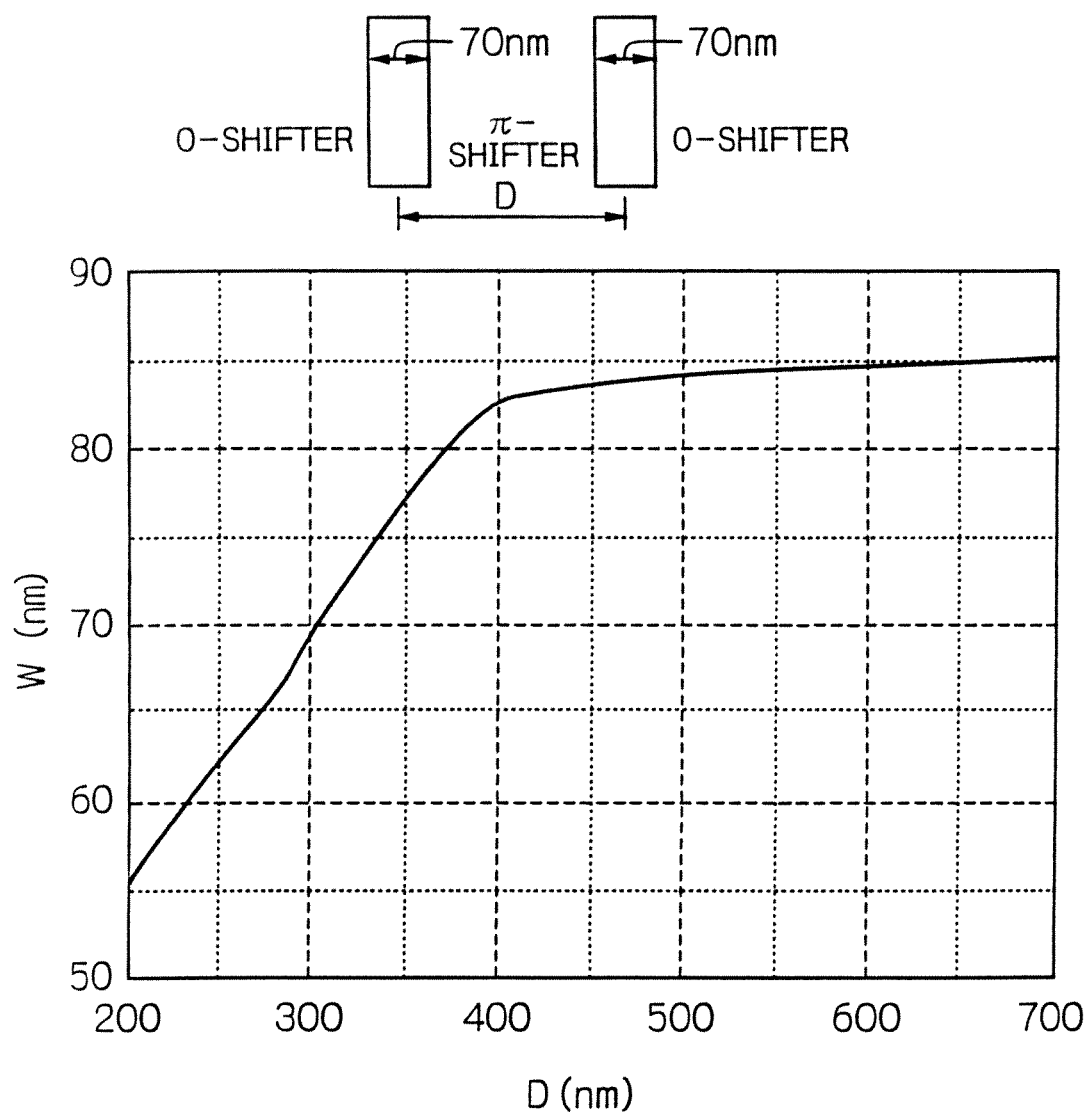
FIG. 12 is a graph for explaining the minimum pitch of the gate patterns of FIG. 9.

The minimum pitch MIN is explained next with reference to FIG. 12 on the condition that the numeral aperture (NA) is 0.68, the exposure light is an ArF light (λ=193 nm), and the width of each of light screen layers is 70 nm. In FIG. 12, the abscissa designates the distance between two light screen layers, and the ordinate designates a width of the obtained gate patterns. That is, when the distance D is changed from about 200 nm to about 700 nm, the width W of the obtained gate patterns is changed from about 55 nm to about 85 nm centered at 70 nm. Therefore, the smaller the distance (or pitch) D, the smaller the width W. In this case, in consideration of the correcting operation, the minimum distance, i.e., the minimum pitch MIN is preferably 200 nm, so as to suppress the deviation of the dimension of the gate patterns. This also would decrease the residual after the optical phase correction.

Figure 13:
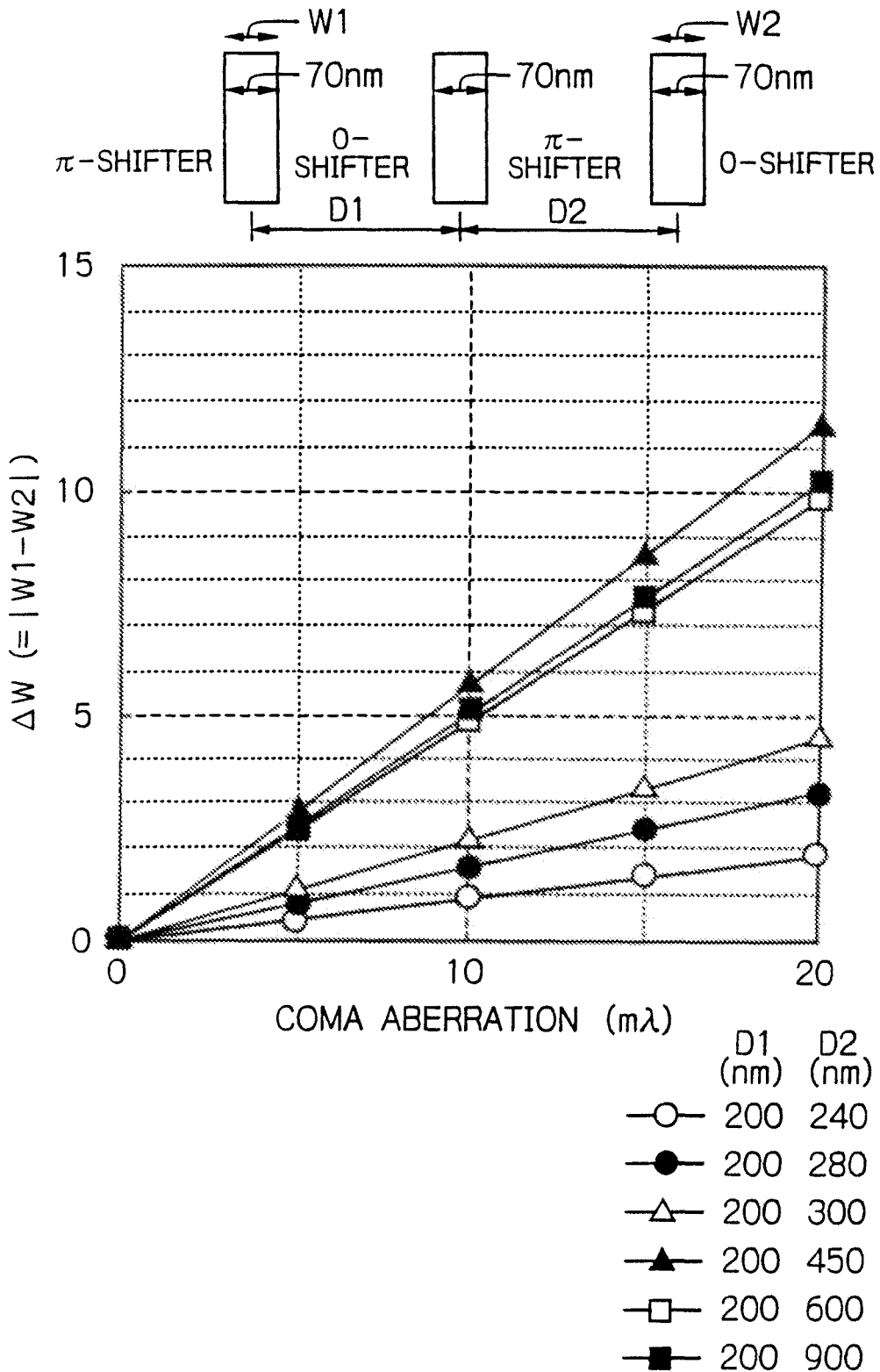
FIG. 13 is a graph for explaining the maximum pitch of the gate patterns of FIG. 9.

The maximum pitch MAX is explained next with reference to FIG. 13 on the condition that the numerical aperture (NA) is 0.68, the exposure light is an ArF light (λ=193 nm), and the width of each light screen layers is 70 nm. In FIG. 13, the abscissa designates the coma aberration between first and second light screen layers sandwiching a third light screen layer, and the ordinate designates the difference (ΔW) in width between the first and second light screen layers. In this case, while the distance D1 between the first and third light screen layers is 200 nm, the distance D2 between the second and third light screen layers is changed from 240 nm to 900 nm. As a result, the difference ΔW is relatively small when the distance D2 between the second and third light screen layers is smaller than 300 nm. Thus, the maximum distance, i.e., the maximum pitch MAX is preferably 300 nm. This would decrease the difference ΔW from about 11.5 nm (non maximum pitch) to about 4.7 nm.

When MIN=200 nm and MAX=300 nm, the pitch ratio MAX/MIN can be 1.5.

Figure 14:
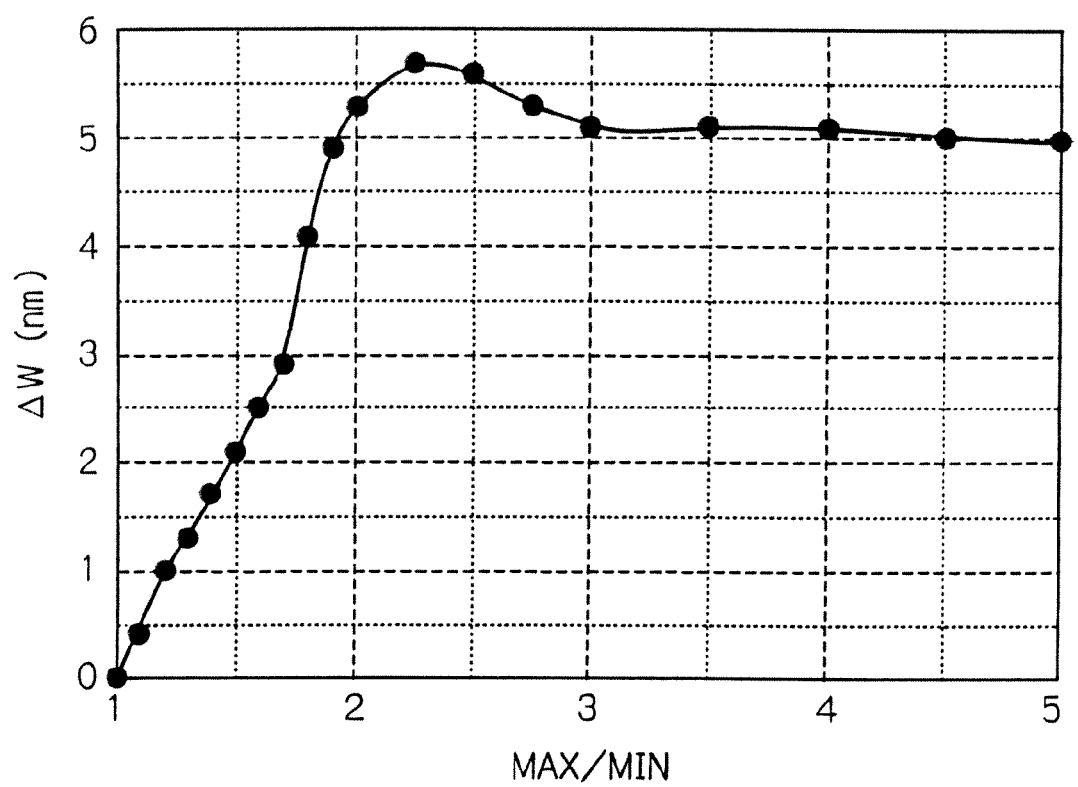
FIG. 14 is a graph for explaining the maximum pitch/the minimum pitch of the gate patterns of FIG. 9.
Figure 15:
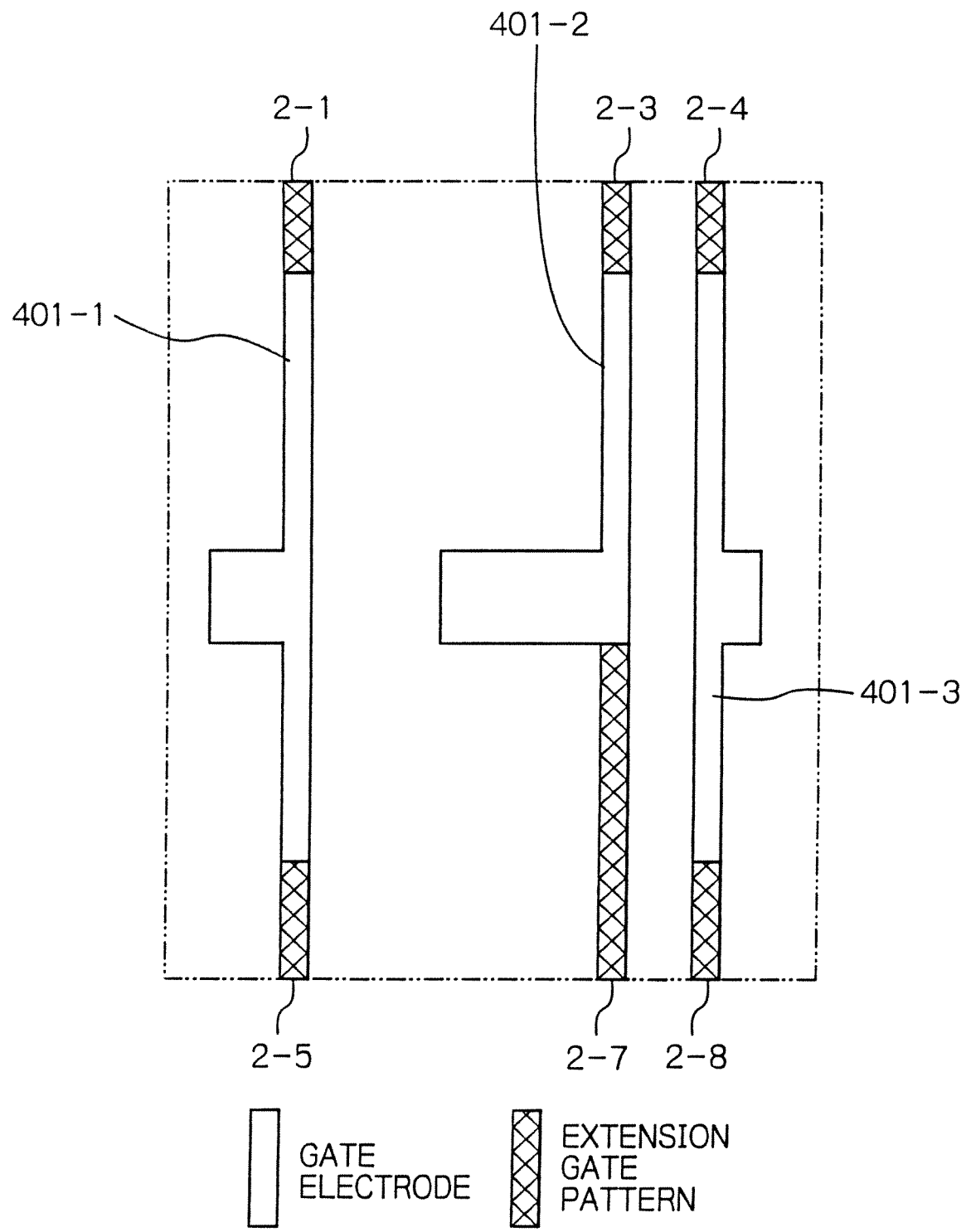
Figure 18:
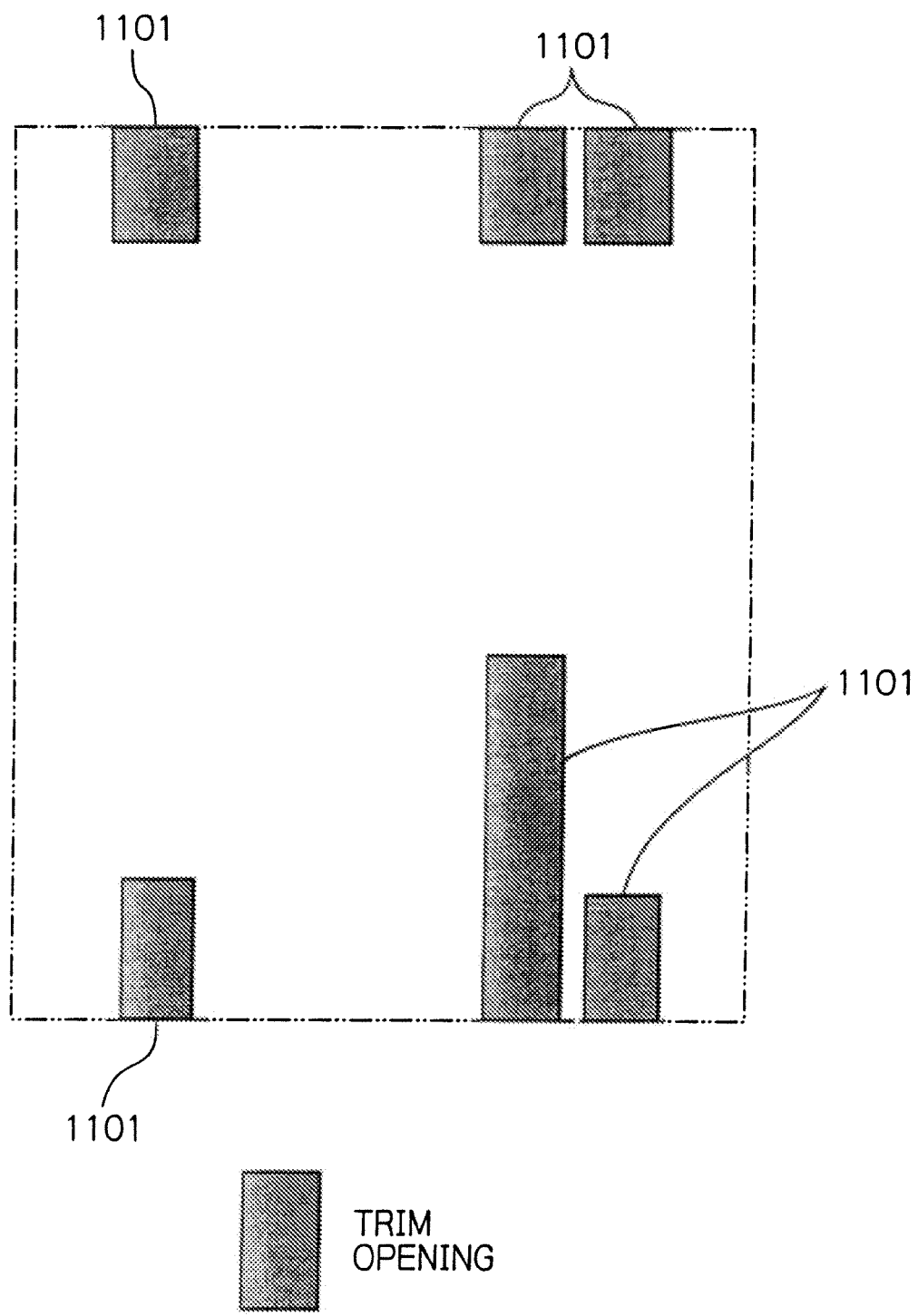

Generally, as illustrated in FIG. 14, the pitch ratio MAX/MIN is changed from 0 to 6, the width difference ΔW is increased. Since the allowable width difference ΔW is required to be 3 nm, the pitch ratio MAX/MIN is required to be smaller than 1.7. Preferably, the allowable width difference ΔW is less than 2 nm, the pitch ratio MAX/MIN is required to be smaller than 1.4. On the other hand, the larger the pitch ratio MAX/MIN, the larger the freedom degree of design layout. Thus, the pitch ratio MAX/MIN is $$1.3 \leq MAX/MIN \leq 1.7 \quad (1)$$

Preferably, $$1.3 \leq MAX/MIN \leq 1.4 \quad (2)$$

The formulae (1) and (2) are replaced by the following formulae (3) and (4), respectively:

$$0.9 \cdot \lambda/NA \leq MAX \leq 1.3 \cdot \lambda/NA \quad (3)$$

$$0.9 \cdot \lambda/NA \leq MAX \leq 1.0 \cdot \lambda/NA \quad (4)$$

where λ is a wavelength of the exposure light; and

NA is a numerical aperture. For example, if λ is 193 nm (ArF) and NA is 0.68, λ/NA=283.8 nm.

According to the present invention, since the gate patterns including the gate electrodes, the dummy gate patterns and the extension gate patterns have pitches between the minimum pitch MIN and the maximum pitch MAX, the distances between the gate patterns can be uniform within one circuit block (cell), which would reduce the optical proximity effect by the light interference, and reduce the aberration of a projection lens such as the coma aberration.

Also, since the entire gate patterns are in parallel with each other, the same type shifter openings hardly adjoin each other, so that the Levenson-type phase shift photomask would remarkably enhance the resolution limit. Also, since various margins in photolithography technology such as the focus margin and the exposure margin are increased, the obtained semiconductor device can be more-fined and the manufacturing yield can be increased.

In FIGS. 15, 16, 17 and 18, which correspond to FIGS. 8, 9, 10 and 11, respectively, the dummy gate patterns 1-1, 1-2 and 1-3 are not provided. Even in this case, although the suppression of the aberration of a projection lens such as the coma aberration is insufficient, the optical proximity effect by the light interference can be sufficiently suppressed.

Note that a half-tone type phase shift photomask can also be applied to the present invention.

The invention claimed is:

1. A method for manufacturing a semiconductor device that includes a plurality of gate patterns in parallel with each other within one circuit block provided over a semiconductor substrate, said method comprising:
   preparing a first photomask,
      wherein in said first photomask at least one dummy gate pattern in parallel with said gate patterns is provided when a pitch between said gate patterns is larger than a predetermined maximum pitch, so that pitches between said gate patterns including said dummy gate pattern are less than said predetermined maximum pitch, and are greater than a minimum pitch, which is a minimum distance between said gate patterns, and
      wherein said first photomask comprises a phase shift photomask that comprises first and second openings whose difference in phase is $\pi$, said first and second openings alternating between said gate patterns including said dummy gate pattern to form phase edges therein;
   performing a first photolithography process upon a photoresist layer within said circuit block by using said first photomask;
   preparing a second photomask,
      wherein said second photomask comprises a trim photomask that comprises at least one trim opening corresponding to said dummy gate pattern to remove a portion of said photoresist layer corresponding to said dummy gate pattern; and
   performing a second photolithography process upon said photoresist layer by using said second photomask.

2. The method as set forth in claim 1, wherein the second photolithography process is performed after said performing said first photolithography process.

3. The method as set forth in claim 1, further comprising:
   forming extension gate patterns on both ends of said gate patterns and said dummy gate pattern.

4. The method as set forth in claim 3, wherein said extension gate patterns extend to an edge of said circuit block.

5. The method as set forth in claim 1, wherein said dummy gate pattern and said gate patterns are formed on said photoresist layer prior to said performing the first photolithography process.

6. The method as set forth in claim 1, wherein, in said performing the second photolithography process, said portion of said photoresist layer corresponding to said dummy gate pattern is removed.

* * * * *